(12) United States Patent
Han et al.

(10) Patent No.: US 11,930,691 B2
(45) Date of Patent: Mar. 12, 2024

(54) APPARATUS FOR MANUFACTURING ORGANIC MATERIAL AND METHOD OF MANUFACTURING ORGANIC MATERIAL USING THE APPARATUS

(71) Applicant: SAMSUNG DISPLAY CO., LTD., Yongin-si (KR)

(72) Inventors: Keun Hee Han, Yongin-si (KR); Jong Woo Lee, Yongin-si (KR); Myung Ki Lee, Yongin-si (KR); Suk Ki, Yongin-si (KR); Jeong Hyeon Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 918 days.

(21) Appl. No.: 16/561,674

(22) Filed: Sep. 5, 2019

(65) Prior Publication Data
US 2020/0083455 A1 Mar. 12, 2020

(30) Foreign Application Priority Data
Sep. 10, 2018 (KR) .......................... 10-2018-0107967

(51) Int. Cl.
*H10K 71/00* (2023.01)
*B01D 7/00* (2006.01)
*B01D 46/00* (2022.01)
*B01D 46/12* (2022.01)
*B01D 46/62* (2022.01)

(52) U.S. Cl.
CPC ............ *H10K 71/311* (2023.02); *B01D 7/00* (2013.01); *B01D 46/0002* (2013.01); *B01D 46/12* (2013.01); *B01D 46/62* (2022.01); *H10K 71/00* (2023.02)

(58) Field of Classification Search
None
See application file for complete search history.

(56) References Cited

U.S. PATENT DOCUMENTS 267,813 A * 11/1882 Wiesebrock .............. F27B 7/00
  432/132
887,004 A * 5/1908 Miles ..................... B01D 47/16
  261/126

(Continued)

FOREIGN PATENT DOCUMENTS

CA  3076654 A1 * 9/2020 ........... B01D 46/002
CN  1714061 A  12/2005

(Continued)

OTHER PUBLICATIONS

Chinese Office Action for CN Application No. 201910742127.3 dated Aug. 16, 2022, 9 pages.

(Continued)

*Primary Examiner* — Brit E. Anbacht
(74) *Attorney, Agent, or Firm* — Lewis Roca Rothgerber Christie LLP

(57) ABSTRACT

An apparatus for manufacturing an organic material includes an outer tube including an internal accommodating space, and at least one loading inner tube and at least one collecting inner tube disposed in the accommodation space, the loading inner tube including a mesh boat disposed in a first direction in which the loading inner tube extends.

5 Claims, 8 Drawing Sheets

(56) References Cited

U.S. PATENT DOCUMENTS

| | | | | |
|---|---|---|---|---|
| 1,080,198 A * | 12/1913 | Cooke | A23L 3/40 | 34/562 |
| 1,716,479 A * | 6/1929 | Billings | B01D 53/86 | 422/177 |
| 1,915,315 A * | 6/1933 | Hoffman | D21C 11/0071 | 423/DIG. 3 |
| 2,248,620 A * | 7/1941 | Freedman | B01D 11/0434 | 422/259 |
| 2,310,645 A * | 2/1943 | Mohun | F24D 19/04 | 55/DIG. 35 |
| 2,850,809 A * | 9/1958 | Lamb | A23L 3/485 | 34/135 |
| 2,911,732 A * | 11/1959 | Webb | F26B 9/066 | 426/442 |
| 3,228,174 A * | 1/1966 | Perry, Jr. | B01D 19/0052 | 55/484 |
| 3,556,734 A * | 1/1971 | Peterson | B01D 47/06 | 422/171 |
| 3,811,252 A * | 5/1974 | Evans | B01D 47/025 | 55/440 |
| 3,888,642 A * | 6/1975 | Toyama | B01D 50/00 | 55/424 |
| 3,888,644 A * | 6/1975 | Holland | B01D 46/00 | 55/318 |
| 4,149,586 A * | 4/1979 | Phillips | F28C 3/16 | 65/114 |
| 4,297,116 A * | 10/1981 | Cusick | B01D 46/0031 | 55/528 |
| 4,359,329 A * | 11/1982 | Willeitner | F25B 43/02 | 210/DIG. 5 |
| 4,411,074 A * | 10/1983 | Daly | F26B 11/0477 | 432/106 |
| 4,437,867 A * | 3/1984 | Lerner | B01D 46/12 | 55/423 |
| 4,496,477 A * | 1/1985 | Ross | G21F 9/32 | 588/2 |
| 4,895,083 A * | 1/1990 | McDilda | B01D 45/08 | 110/235 |
| 5,308,385 A * | 5/1994 | Winn | B01D 47/06 | 95/200 |
| 6,168,647 B1 * | 1/2001 | Perry, Jr. | B01D 46/64 | 95/286 |
| 6,220,287 B1 * | 4/2001 | Wolf | B64G 1/402 | 137/574 |
| 7,448,144 B2 * | 11/2008 | Johnson | A61L 9/013 | 34/79 |
| 9,266,047 B2 * | 2/2016 | Piszczek | B01D 45/04 | |
| 9,469,898 B2 * | 10/2016 | Gregg | F17C 11/00 | |
| 9,615,604 B2 * | 4/2017 | Russick | F26B 9/082 | |
| 9,812,665 B2 | 11/2017 | Park et al. | | |
| 10,780,382 B2 * | 9/2020 | Katefidis | B01D 46/121 | |
| 11,071,934 B2 * | 7/2021 | Cloud | B01D 46/64 | |
| 11,426,678 B2 * | 8/2022 | Hong | H01L 51/0025 | |
| 2002/0121360 A1 * | 9/2002 | Curry | F28B 3/00 | 165/110 |
| 2005/0051066 A1 * | 3/2005 | May | F23G 5/20 | 110/341 |
| 2008/0314248 A1 * | 12/2008 | Peteln | B01D 45/12 | 55/482 |
| 2009/0181168 A1 * | 7/2009 | Chaubey | C23C 16/4481 | 118/725 |
| 2010/0255198 A1 * | 10/2010 | Cleary | C23C 16/4402 | 427/255.39 |
| 2012/0210688 A1 * | 8/2012 | Burns | B01D 46/64 | 55/483 |
| 2013/0216948 A1 | 8/2013 | Kasahara et al. | | |
| 2013/0216968 A1 * | 8/2013 | Lee | F27D 5/00 | 432/207 |
| 2014/0373714 A1 * | 12/2014 | Cloud | B01D 46/0031 | 55/423 |
| 2015/0108668 A1 | 4/2015 | Baeck et al. | | |
| 2015/0128543 A1 * | 5/2015 | Piszczek | B01D 50/20 | 55/440 |
| 2015/0367372 A1 * | 12/2015 | Roeckle | B05B 14/43 | 55/495 |
| 2017/0361258 A1 * | 12/2017 | Cloud | B01D 46/58 | |
| 2018/0142951 A1 * | 5/2018 | Momen | F26B 5/02 | |
| 2018/0168203 A1 * | 6/2018 | Wicherski | F26B 3/04 | |
| 2019/0217237 A1 * | 7/2019 | Cloud | B01D 46/2403 | |
| 2021/0275956 A1 * | 9/2021 | Cloud | B01D 46/521 | |
| 2022/0290280 A1 * | 9/2022 | Masten, Jr. | G01K 1/14 | |

FOREIGN PATENT DOCUMENTS

| | | | |
|---|---|---|---|
| CN | 101920148 A | | 12/2010 |
| CN | 104218189 A | | 12/2014 |
| CN | 104383712 A | | 3/2015 |
| CN | 105457407 A | | 4/2016 |
| CN | 206262138 U | | 6/2017 |
| CN | 112704964 A | * | 4/2021 |
| CN | 113708287 A | * | 11/2021 |
| CN | 216181516 U | * | 4/2022 |
| EP | 0714999 A1 | | 6/1996 |
| JP | 2005-313069 A | | 11/2005 |
| JP | 2014-18787 A | | 2/2014 |
| JP | 5992543 B2 | | 8/2016 |
| KR | 10-2012-0061137 A | | 6/2012 |
| KR | 10-1160329 B1 | | 6/2012 |
| KR | 10-2013-0096370 A | | 8/2013 |
| KR | 10-2013-0129728 A | | 11/2013 |
| KR | 10-2014-0104230 A | | 8/2014 |
| KR | 10-2014-0146385 A | | 12/2014 |
| KR | 10-2017-0087011 A | | 7/2017 |
| KR | 10-1793425 B1 | | 11/2017 |
| KR | 20190042134 A | * | 4/2019 ............ A23L 3/40 |
| WO | WO 2014/129809 A1 | | 8/2014 |

OTHER PUBLICATIONS

Korean Notice of Allowance issued in corresponding application No. KR 10-2018-0107967, dated Jun. 23, 2023, 2 pages.

\* cited by examiner

APPARATUS FOR MANUFACTURING ORGANIC MATERIAL AND METHOD OF MANUFACTURING ORGANIC MATERIAL USING THE APPARATUS

CROSS-REFERENCE TO RELATED APPLICATION

Korean Patent Application No. 10-2018-0107967, filed on Sep. 10, 2018, in the Korean Intellectual Property Office, and entitled: "Apparatus for Manufacturing Organic Material and Method of Manufacturing Organic Material Using the Apparatus," is incorporated by reference herein in its entirety.

BACKGROUND

1. Field

Embodiments relate to an apparatus for manufacturing organic material and method of manufacturing organic material using the apparatus.

2. Description of the Related Art

Organic materials used for organic light emitting devices require purification. The technology of purifying organic materials is designed to separate only pure pigment components from a synthesized material and use the pure pigment components for thin-film deposition. With the improvement of the organic material purification technology, color purity and luminous efficiency are improved, and the luminescent lifetime of organic light emitting devices is extended.

SUMMARY

Embodiments are directed to an apparatus for manufacturing an organic material, the apparatus including an outer tube including an internal accommodating space, and at least one loading inner tube and at least one collecting inner tube disposed in the accommodation space, the loading inner tube including a mesh boat disposed in a first direction in which the loading inner tube extends.

Embodiments are also directed to a method of manufacturing an organic material, the method including loading an organic material to be purified on a mesh boat, subliming the organic material to both above and below the mesh boat by applying heat to the organic material, and obtaining at least a portion of the sublimed organic material.

BRIEF DESCRIPTION OF THE DRAWINGS

Features will become apparent to those of skill in the art by describing in detail example embodiments with reference to the attached drawings in which.

DETAILED DESCRIPTION

Figure 1:
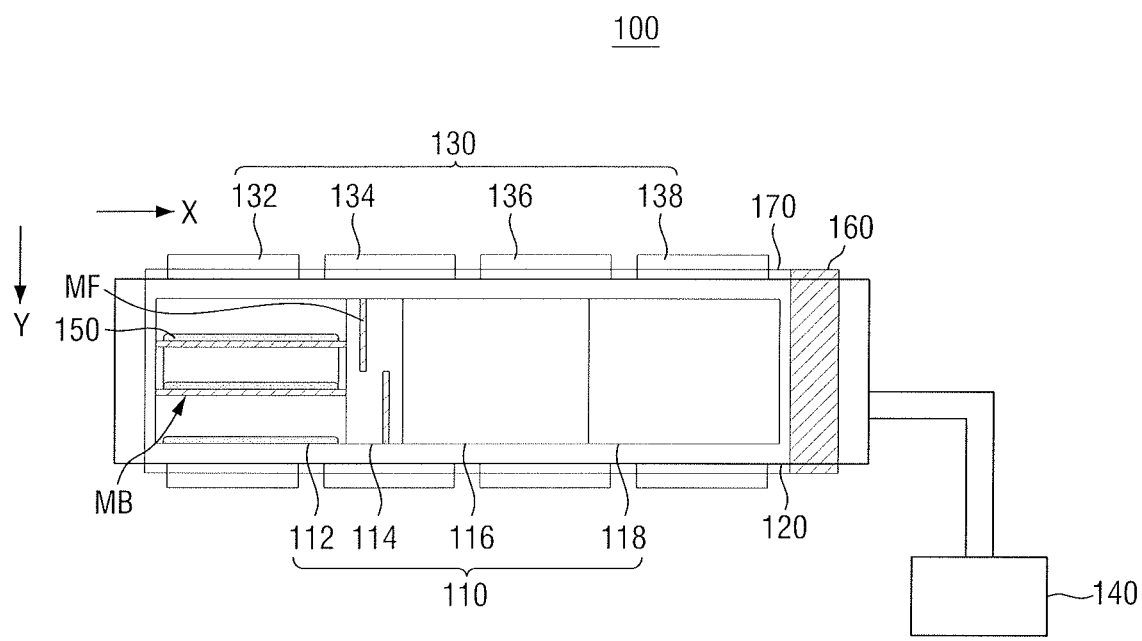
FIG. 1 illustrates a schematic view of an apparatus for manufacturing an organic material according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a schematic view of an apparatus 100 for manufacturing an organic material according to an example embodiment.

Referring to FIG. 1, the apparatus 100 for manufacturing an organic material according to the present example embodiment includes an outer tube 120 including an internal accommodating space, an inner tube 110 disposed in the accommodating space of the outer tube 120, a heating unit 130 disposed outside the outer tube 120, a heat conduction tube 170 disposed between the outer tube 120 and the heating unit 130, a cooling unit 160 disposed at a distal end of the heat conduction tube 170, and a vacuum pump 140 connected to the cooling unit 160 disposed at the distal end of the heat conduction tube 170 and the outer tube 120 so as to provide a low pressure state to the inside of the outer tube 120 and the inner tube 110.

The accommodating space included in the outer tube 120 may be, for example, in the shape of a hollow tube.

The inner tube 110 may include a plurality of inner tubes 112, 114, 116, and 118, and the inner tubes 112, 114, 116, and 118 may be successively arranged in the accommodating space inside the outer tube 120 along a first direction X in which the outer tube 120 extends. In addition, the inner tubes 112, 114, 116, and 118 may be separated from each other when an organic material 150 to be purified is loaded and after a purification operation is completed.

The inner tubes 112, 114, 116, and 118 may include at least one loading inner tube 112 for loading the organic material 150 to be purified, one or more collecting inner tubes 116 and 118 for collecting a purified organic material, and a buffer inner tube 114 disposed between the loading inner tube 112 and the collecting inner tubes 116 and 118.

The buffer inner tube 114 may prevent the temperature of the loading inner tube 112 from being lowered due to the temperature difference between the loading inner tube 112 and the collecting inner tube 116 adjacent to the loading inner tube 112. The buffer inner tube 114 may be heated to a temperature equal to or higher than the heating temperature of the loading inner tube 112.

The collecting inner tubes 116 and 118 may collect different materials. The collecting inner tubes 116 and 118 may be disposed closer to the vacuum pump 140 than the loading inner tube 112.

In the loading inner tube 112 of the organic material manufacturing apparatus 100 according to the present example embodiment, a mesh boat MB for loading the organic material 150 to be purified may be disposed in the first direction X in which the loading inner tube 112 extends.

The organic material 150 to be purified loaded on the mesh boat MB may be sublimed in both upward and downward directions. Therefore, it may be possible to prevent ash generated in the process of subliming the organic material 150 from covering the organic material 150 in the loading inner tube 112 and thus interrupting the purification process.

The organic material 150 to be purified may be divided and loaded onto multiple layers of the mesh boat MB. Thus, the purification time may be shortened, and the yield may be improved.

Mesh filters MF may be disposed in the buffer inner tube 114 in a second direction Y perpendicular to the first direction X. The mesh filters MF disposed in the buffer inner tube 114 may filter ash generated in the process of subliming the organic material 150 during the purification of an organic material for manufacturing an organic light emitting device, which may help prevent the ash from flowing into the collecting inner tubes 116 and 118 and thus degrading the quality of a collected organic material.

The mesh boat MB and the mesh filters MF are described in more detail below.

At least one surface of the loading inner tube 112 may be open or closed.

In the present example embodiment, a surface of the loading inner tube 112 on the side of the vacuum pump 140 is open and a surface opposite to the vacuum pump 140 is closed, such that a portion of an organic material flowing to the outside of the loading inner tube 112 may be blocked by the closed surface on one side of the loading inner tube 112 and made to flow back toward the vacuum pump 140. Therefore, it may be possible to minimize the amount of organic material crystallized on the closed surface, thereby improving the yield.

The heating unit 130 may include two or more independent heaters separated along the outer tube 120. In the present example embodiment, a case where four heaters 132, 134, 136, and 138 are provided will be described.

The heaters 132, 134, 136, and 138 may be heated to the same temperature or different temperatures so as to adjust the inner tubes 112, 114, 116, and 118 to the same temperature or different temperatures.

The heat conduction tube 170 may be disposed between the outer tube 120 and the heaters 132, 134, 136, and 138. The heat conduction tube 170 may conduct heat generated by the heaters 132, 134, 136, and 138 and may further include a temperature sensor for sensing the temperatures of the inner tubes 112, 114, 116, and 118.

A cooling line may be installed at the distal end of the heat conduction tube 170 to provide the cooling unit 160 for cooling the inner tubes 112, 114, 116, and 118.

In the organic material manufacturing apparatus 100 according to the present example embodiment, the vacuum pump 140 may be provided to put the inside of the outer tube 120 and the inner tubes 112, 114, 116, and 118 in a low pressure state. For example, the vacuum pump 140 having a capacity to put the pressure inside the outer tube 120 at $10^{-5}$ Pa to 200 Pa may be provided.

According to the above configuration, an organic material sublimed in both the upward and downward directions on the mesh boat MB of the loading inner tube 112 by the operation of the heating unit 130 may be moved to the collecting inner tubes 116 and 118 via the buffer inner tube 114 by the driving of the vacuum pump 140 and crystallized in the collecting inner tubes 116 and 118. After the completion of all operations, the organic material crystallized in the collecting inner tubes 116 and 118 may be collected.

In the organic material manufacturing apparatus 100 according to the present example embodiment, the buffer inner tube 114 is disposed between the loading inner tube 112 and the collecting inner tubes 116 and 118, and the mesh filters MF are disposed in the buffer inner tube 114 to filter the ash generated in the process of subliming an organic material.

Figure 2:
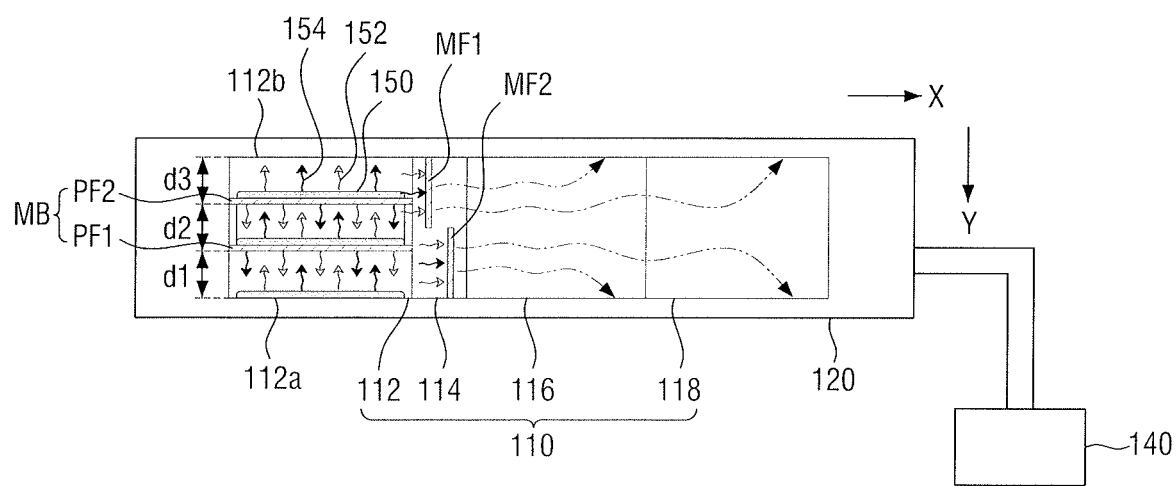
FIG. 2 illustrates a schematic view of an outer tube and inner tubes of the apparatus for manufacturing an organic material according to an example embodiment.

FIG. 2 is a schematic view of the outer tube 120 and the inner tube 110 of the apparatus 100 for manufacturing an organic material according to an example embodiment.

Referring to FIG. 2, the organic material manufacturing apparatus 100 (see FIG. 1) according to the present example embodiment includes the outer tube 120 including the internal accommodating space, the inner tubes 112, 114, 116, and 118 disposed in the accommodating space of the outer tube 120, and the vacuum pump 140 connected to the outer tube 120 so as to provide a low pressure state to the inside of the outer tube 120 and the inner tube 110.

Here, a vacuum atmosphere is formed inside the outer tube 120. The outer tube 120 may have a predetermined length and may be configured to accommodate the inner tube 110.

The outer tube 120 may include, in its inner lower part, a transfer unit for moving the inner tube 110 from a central part along the first direction X in which the outer tube 120 extends and inserting the inner tube 110 into the outer tube 120. In another implementation, the outer tube 120 may not include the transfer unit and may be configured such that the inner tube 110 can be manually pushed and inserted into the outer tube 120.

The inner tube 110 may have a smaller diameter than the outer tube 120, may have a predetermined length corresponding to the outer tube 120, and may be inserted into the outer tube 120.

The inner tube 110 may include a plurality of inner tubes 112, 114, 116, and 118, and the inner tubes 112, 114, 116, and 118 may be successively arranged along the first direction X.

In addition, the inner tubes 112, 114, 116, and 118 may be separated from each other when the organic material 150 to be purified is loaded and after a purification operation is completed.

The inner tubes 112, 114, 116, and 118 may include at least one loading inner tube 112 for loading the organic material 150 to be purified, one or more collecting inner tubes 116 and 118 for collecting a purified organic material, and the buffer inner tube 114 disposed between the loading inner tube 112 and the collecting inner tubes 116 and 118.

Here, a case where the inner tubes 112, 114, 116 and 118 are arranged sequentially in the order of the loading inner tube 112, the buffer inner tube 114, the first collecting inner tube 116 and the second inner collecting tube 118 will be described as an example.

The organic material 150 to be purified may be an organic material for manufacturing an organic light emitting device. For example, the organic material 150 to be purified may include at least one of an organic material for forming a light emitting layer, an organic material for forming a hole injection layer, an organic material for forming a hole transport layer, an organic material for forming an electron injection layer, and an organic material for forming an electron transport layer.

In addition, the organic material 150 disposed in the loading inner tube 112 may be solid powder and may be a mixture of various materials having different sublimation temperatures. A desired material may be a material that is recrystallized in a high temperature region, and impurities not desired may be recrystallized in a low temperature region.

The inner tubes 112, 114, 116, and 118 of the organic material manufacturing apparatus 100 (see FIG. 1) may be heated to different temperatures by different heaters 132, 134, 136 and 138 (see FIG. 1). Thus, as a mixed material in a gas phase passes through the inner tubes 112, 114, 116, and 118, a material having a condensation temperature or a recrystallization temperature corresponding to the temperature of each of the inner tubes 112, 114, 116, and 118 may be extracted in a liquid phase or a solid phase. In this way, a specific material may be separated.

In the manufacturing process, the inner tubes 112, 114, 116, and 118 are evacuated by using the vacuum pump 140. For example, the inner tubes 112, 114, 116, and 118 may be evacuated to about 200 Pa by using the vacuum pump 140.

The surface of the loading inner tube 112 on the side of the vacuum pump 140 may be open while the surface of the loading inner tube 112 opposite to the vacuum pump 140 may be closed. Thus, a slight pressure gradient may be formed in the evacuation process. For example, a pressure gradient may be formed in which the pressure decreases from the loading inner tube 112 toward the collecting inner tubes 116 and 118.

The inner tubes 112, 114, 116, and 118 may be heated to different temperatures by operating the heaters 132, 134, 136 and 138 (see FIG. 1). For example, the temperature may decrease from the loading inner tube 112 toward the second collecting inner tube 118. The buffer inner tube 114 may be heated to a temperature equal to or higher than the temperature of the loading inner tube 112 in order to prevent the temperature of the loading inner tube 112 from being lowered due to the temperature difference between the loading inner tube 112 and the first collecting inner tube 116 adjacent to the loading inner tube 112.

The temperature may be constant in each of the loading inner tube 112, the buffer inner tube 114, the first collecting inner tube 116, and the second collecting inner tube 118, while a temperature distribution may be formed across all of the loading inner tube 112, the buffer inner tube 114, the first collecting inner tube 116, and the second collecting inner tube 118.

The organic material 150 located in the loading inner tube 112 starts to sublime when heated to a temperature higher than a sublimation point, and the organic material 152 sublimed in the loading inner tube 112 moves from the loading inner tube 112 to the first and second collecting inner tubes 116 and 118 via the buffer inner tube 114 according to the pressure gradient.

The organic material 152 sublimed in the loading inner tube 112 may move to the first collecting inner tube 116 via the buffer inner tube 114, and a material contained in the sublimed organic material 152 may be condensed or recrystallized according to the temperature of the first collecting inner tube 116.

Then, materials that have not been condensed or recrystallized at the temperature of the first collecting inner tube 116 may move to the second collecting inner tube 118, and a material contained in the sublimed organic material 152 may be condensed according to the temperature of the second collecting inner tube 118. By using this principle, it may be possible to obtain a desired material according to the temperature of each of the inner tubes 112, 114, 116, and 118.

In the organic material manufacturing apparatus 100 (see FIG. 1) according to the present example embodiment, the mesh boat MB for loading the organic material 150 to be purified into the loading inner tube 112 may be disposed in the first direction X in which the loading inner tube 112 extends.

The mesh boat MB may include a first flat surface PF1 and a second flat surface PF2 on which the organic material 150 to be purified can be placed. In other implementations, the mesh boat MB may include one flat surface, or three or more flat surfaces.

Each of the first and second flat surfaces PF1 and PF2 may be shaped like or formed as a metal mesh including a plurality of holes.

The first and second flat surfaces PF1 and PF2 may be made of, for example, stainless steel, aluminum, gold, silver, platinum, nickel, perfluorinated polymers such as Teflon, etc.

The holes of the mesh included in each of the first and second flat surfaces PF1 and PF2 may be fine enough to allow solid powder, which is the organic material 150 to be purified, to be placed on the first and second flat surfaces PF1 and PF2. For example, each of the holes may have a width of 0.001 to 0.1 μm so that the solid powder as the organic material 150 to be purified cannot pass through the holes while the sublimed organic material 152 can pass through the holes.

The widths of the holes (of the mesh) included in each of the first flat surface PF1 and the second flat surface PF2 may be equal to each other, or the widths of the holes included in each of the first flat surface PF1 and the second flat surface PF2 may be different from each other.

The first flat surface PF1 and the second flat surface PF2 may be spaced apart from each other in the second direction Y perpendicular to the first direction X. If the distance between the first flat surface PF1 and the second flat surface PF2 is too small, the transfer of heat and the flow of the sublimed organic material 152 may be difficult. If the distance is too large, the space utilization of the loading inner tube 112 may be low. In an embodiment, the first flat surface PF1 and the second flat surface PF2 may be arranged to equally divide the loading inner tube 112 in the second direction Y. For example, referring to FIG. 2, a distance d1 between a lower surface 112a of the loading inner tube 112 and the first flat surface PF1, a distance d2 between the first flat surface PF1 and the second flat surface PF2, and a distance d3 between the second flat surface PF2 and an upper surface 112b of the loading inner tube 112 may be equal.

The structure of the mesh boat MB may provide for flow of the sublimed organic material 152 to regions above the first and second flat surfaces PF1 and PF2 while enabling the organic material 150 to be loaded on the lower surface 112a of the loading inner tube 112, which may allow for an increase in the amount of the organic material 150 loaded and thus may shorten the purification time per unit for a larger amount of material.

As described above, each of the first flat surface PF1 and the second flat surface PF2 may be formed as a metal mesh. Thus, the organic material 150 loaded on each of the first flat surface PF1 and the second flat surface PF2 may sublime to regions both above and below the first flat surface PF1 and the second flat surface PF2. This may shorten the purification time, which, in turn, may increase the production rate of the manufacturing process.

When ash 154 is generated in the process of subliming the organic material 150, it may cover an upper portion of the organic material 150 in the loading inner tube 112 but the organic material 150 may still sublime to below the first flat surface PF1 and the second flat surface PF2 because the ash 154 generated in the process of subliming the organic material 150 may not block the holes of the first flat surface PF1 and the second flat surface PF2. Therefore, interruption of the purification process may be avoided.

In the organic material manufacturing apparatus 100 according to the present example embodiment, mesh filters MF1 and MF2 are disposed in the second direction Y perpendicular to the first direction X in the buffer inner tube 114 disposed between the loading inner tube 112 and the collecting inner tubes 116 and 118.

The mesh filters MF1 and MF2 may be disposed in the buffer inner tube 114 and may be arranged not to overlap each other in the vertical direction, i.e., they may be offset in a horizontal direction. The mesh filters MF1 and MF2 may be spaced apart from each other in the first direction X in order for smooth flow of the sublimed organic material 152.

Each of the mesh filters MF1 and MF2 may include a filter portion shaped like a metal mesh including a plurality of holes. The filter portion may be made of, for example, stainless steel, aluminum, gold, silver, platinum, nickel, perfluorinated polymers such as Teflon, etc.

The width of each of the holes included in the filter portion may be, for example, 0.001 to 0.1 μm. Accordingly, the holes may pass the sublimed organic material 152 while filtering the ash 154 generated in the process of subliming the organic material 150 to be purified, thereby preventing the ash 154 from flowing into the collecting inner tubes 116 and 118 and degrading the quality of a collected organic material.

As described above, in the organic material manufacturing apparatus 100 (see FIG. 1) according to the present example embodiment, the mesh boat MB is disposed in the loading inner tube 112, and the organic material 150 to be purified is loaded on the first and second flat surfaces PF1 and PF2 of the mesh boat MB so that the organic material 150 to be purified can sublime to both above and below the first and second flat surfaces PF1 and PF2.

Accordingly, it may be possible to prevent the ash 154 generated in the process of subliming the organic material 150 from covering the upper portion of the organic material 150 in the loading inner tube 112 and thus interrupting the manufacturing process while increasing the production rate of the manufacturing process.

Further, the mesh filters MF1 and MF2 disposed apart from each other in the buffer inner tube 114 may prevent the ash 154 from flowing into the collecting inner tubes 116 and 118. Thus, the mesh filters MF1 and MF2 may improve the quality of a manufactured organic material.

Figure 3:
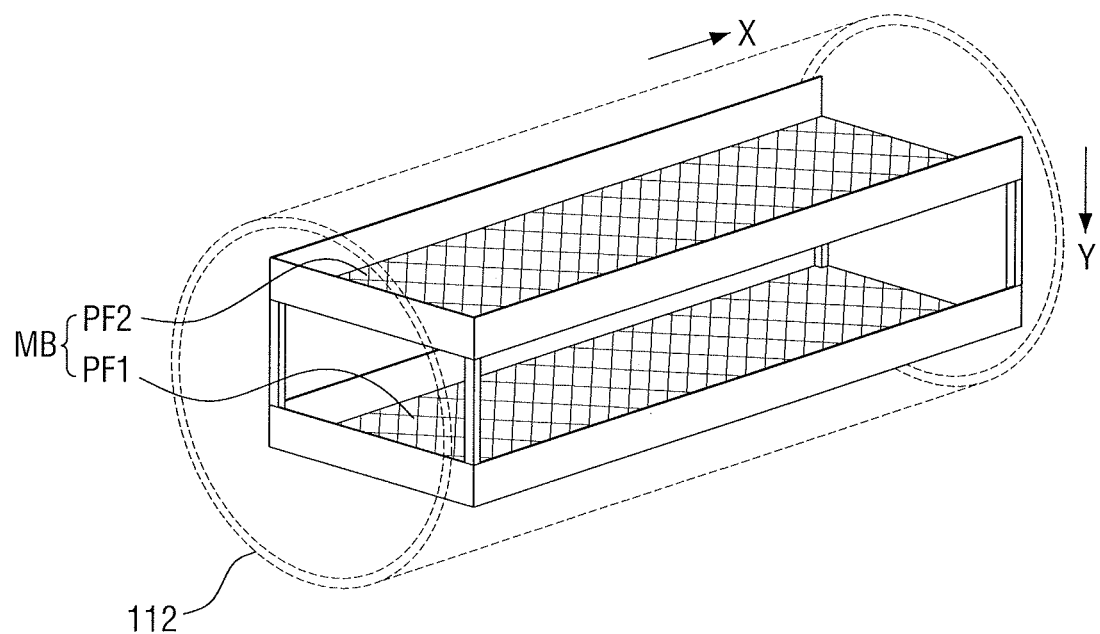
FIG. 3 illustrates a schematic view of a loading inner tube of the apparatus for manufacturing an organic material according to an example embodiment.
Figure 4:
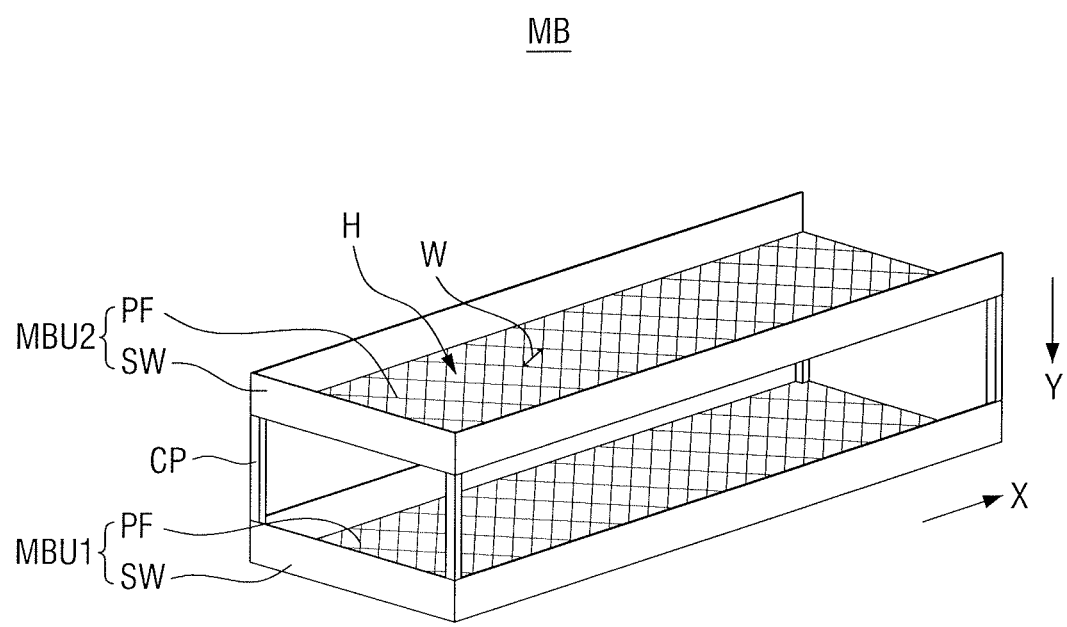
FIG. 4 illustrates a schematic view of a mesh boat of the apparatus for manufacturing an organic material according to an example embodiment.

FIG. 3 schematically shows the loading inner tube 112 of the apparatus 100 for manufacturing an organic material according to the an example embodiment, and FIG. 4 illustrate an example of the mesh boat MB of the apparatus 100 for manufacturing an organic material according to an example embodiment.

Referring to FIG. 3, the loading inner tube 112 including the internal accommodating space and the mesh boat MB disposed in the accommodating space of the loading inner tube 112 are illustrated.

The accommodating space included in the loading inner tube 112 may be in the shape of a hollow tube. The loading inner tube 112 may be circular in cross section or may have various shapes such as an oval shape and a polygonal shape.

The loading inner tube 112 may be made of a transparent material such as quartz, glass or borosilicate glass, or may be made of metal, etc.

The mesh boat MB for loading the organic material 150 (see FIG. 2) to be purified is disposed in the accommodating space of the loading inner tube 112 in the first direction X in which the loading inner tube 112 extends.

The mesh boat MB may have a rectangular planar shape having long sides disposed in the first direction X or the mesh boat MB may have various planar shapes.

The mesh boat MB may include the first flat surface PF1 and the second flat surface PF2 on which the organic material 150 (see FIG. 2) to be purified can be placed, or the mesh boat MB may include one flat surface or three or more flat surfaces.

The first flat surface PF1 and the second flat surface PF2 may be spaced apart from each other in the second direction Y perpendicular to the first direction X. If the distance between the first flat surface PF1 and the second flat surface PF2 is too small, the transfer of heat and the flow of the sublimed organic material 152 may be difficult. If the distance is too large, the space utilization of the loading inner tube 112 may be low. In an embodiment, the first flat surface PF1 and the second flat surface PF2 may be arranged to equally divide the loading inner tube 112 in the second direction Y.

The first flat surface PF1 and the second flat surface PF2 may completely overlap each other, or the first flat surface PF1 and the second flat surface PF2 may also partially overlap each other.

The first flat surface PF1 and the second flat surface PF2 of the mesh boat MB may be spaced apart from the loading inner tube 112 by a certain distance. For example, the upper surface 112b (see FIG. 2) of the loading inner tube 112 and the second flat surface PF2 may be spaced apart from each other in order to improve the flow of the sublimed organic material 152 (see FIG. 2) to above the second flat surface PF2, and the lower surface 112a (see FIG. 2) of the loading inner tube 112 and the first flat surface PF1 may be spaced apart from each other in order to load the organic material 150 (see FIG. 2) to be purified on the lower surface 112a of the loading inner tube 112. Therefore, the amount of the organic material 150 (see FIG. 2) loaded may be increased, which, in turn, may shorten the purification time.

Referring to FIG. 4, the mesh boat MB may include first and second rectangular mesh boat units MBU1 and MBU2 and connection members CP connecting the first and second mesh boat units MBU1 and MBU2.

Each of the first and second mesh boat units MBU1 and MBU2 may include a flat surface PF and a sidewall SW disposed at an end of the flat surface PF.

The flat surface PF may be rectangular or may have various shapes.

The flat surface PF may be shaped like a metal mesh including a plurality of holes H.

The flat surface PF may be made of stainless steel, aluminum, gold, silver, platinum, nickel, Teflon, etc.

The holes H included in each flat surface PF may be formed fine enough to allow solid powder, which is the organic material 150 (see FIG. 2) to be purified, to be placed on the flat surface PF. For example, each of the holes H may have a width W of 0.001 to 0.1 μm so that the solid powder as the organic material 150 (see FIG. 2) to be purified cannot pass through the holes H while the sublimed organic material 152 can pass through the holes H.

The widths W of the holes H included in the flat surface PF of each of the first and second mesh boat units MBU1 and MBU2 may be equal to each other, or the widths W of the holes H included in the flat surface PF of each of the first and second mesh boat units MBU1 and MBU2 may be different from each other.

The sidewall SW may be disposed at at least one of the ends of the flat surface PF. For example, the sidewall SW may be disposed at each of the four ends of the flat surface PF. In an implementation, the sidewall SW disposed at an end adjacent to the buffer inner tube 114 (see FIG. 2) among the four ends may be omitted.

The connection members CP connecting the first and second mesh boat units MBU1 and MBU2 in the second direction Y may be disposed between the first and second mesh boat units MBU1 and MBU2.

The connection members CP may be bar-shaped and disposed between the first and second mesh boat units MBU1 and MBU2. For example, the connection members CP may connect corners of the first and second mesh boat units MBU1 and MBU2 to each other.

FIGS. 5 through 8 respectively are schematic views of example mesh boats of the apparatus 100 for manufacturing an organic material according to example embodiments.

Figure 5:
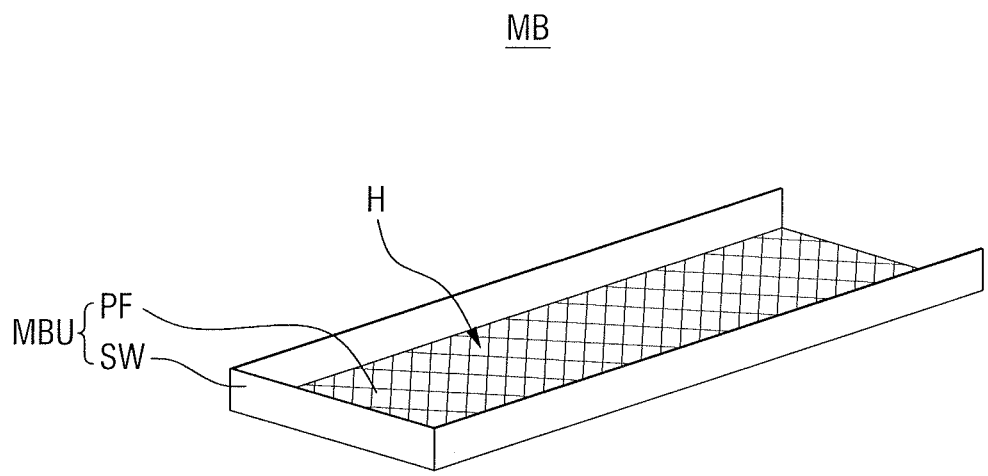
FIGS. 5 through 8 respectively illustrate schematic views of example mesh boats of the apparatus for manufacturing an organic material according to example embodiments.

Referring to FIG. 5, a mesh boat MB of the organic material manufacturing apparatus 100 (see FIG. 1) according to an example embodiment may be composed of a single mesh boat unit MBU. The mesh boat MB may be composed of a flat surface PF and a sidewall SW disposed at an end of the flat surface PF. In this case, connection members CP may be omitted.

Figure 6:
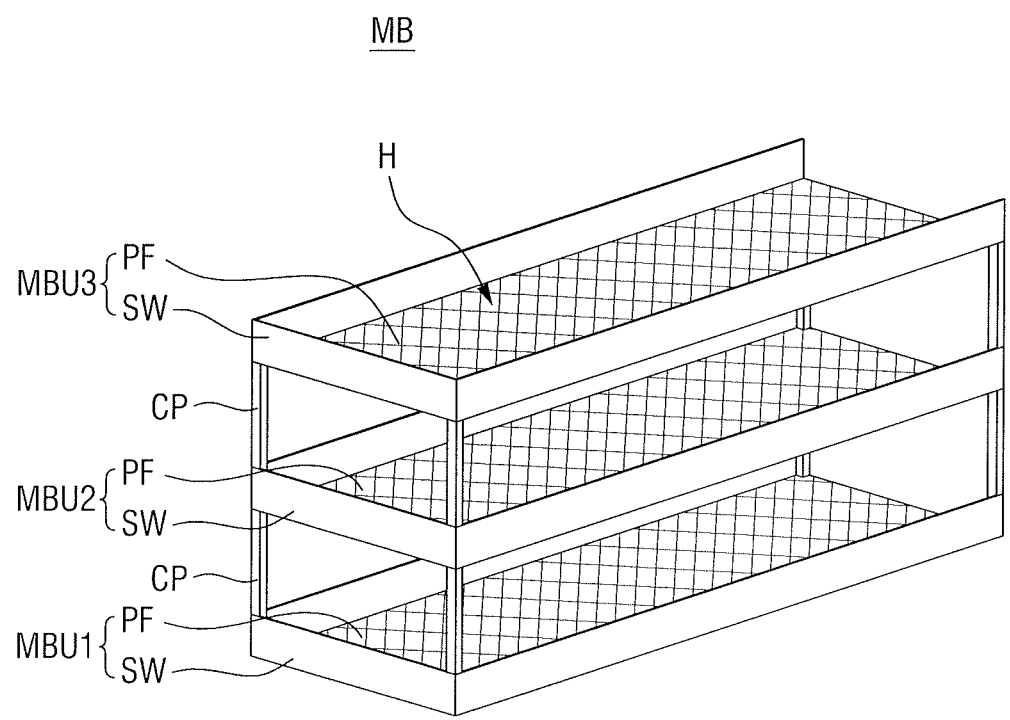

Referring to FIG. 6, a mesh boat MB of the organic material manufacturing apparatus 100 (see FIG. 1) according to an example embodiment may be composed of three mesh boat units MBU1, MBU2 and MBU3. The mesh boat MB may be composed of first, second and third mesh boat units MBU1, MBU2 and MBU3, and each of the first, second and third mesh boat units MBU1, MBU2 and MBU3 may be composed of a flat surface PF and a sidewall SW disposed at an end of the flat surface PF. In this case, connection members CP may be disposed between the first and second mesh boat units MBU1 and MBU2 and between the second and third mesh boat units MBU2 and MBU3.

Figure 7:
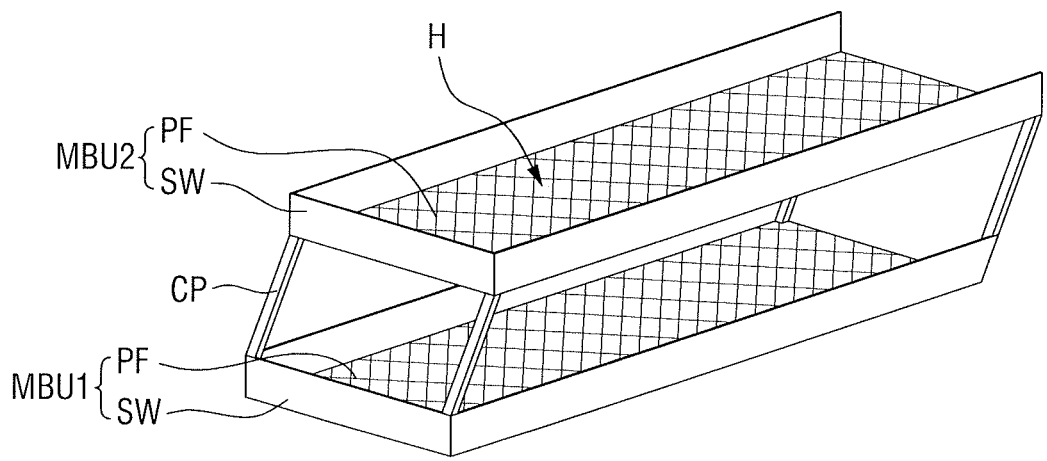
Figure 8:
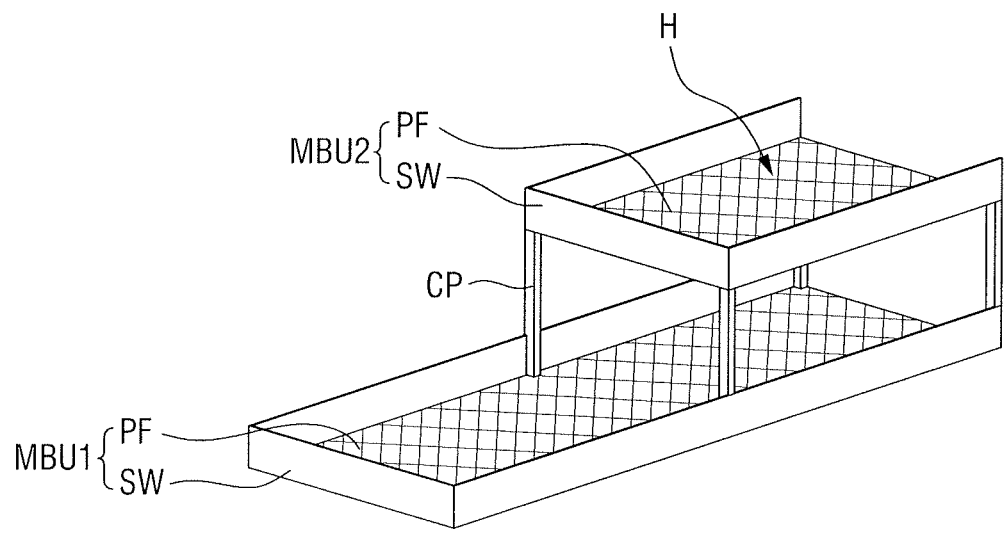

Referring to FIG. 7, first and second mesh boat units MBU1 and MBU2 may have the same size and may partially overlap each other. Referring to FIG. 8, a first mesh boat unit MBU1 and a second mesh boat unit MBU2 may have different sizes.

As described above, the mesh boat MB of the organic material manufacturing apparatus 100 (see FIG. 1) according to example embodiments may be composed of a single mesh boat unit or a plurality of mesh boat units MBU according to the size of the loading inner tube 112 (see FIG. 3), the type of the organic material 150 (see FIG. 2) to be purified, the heating temperature, etc. The mesh boat units MBU may have the same or different sizes and may be arranged in various forms.

Figure 9:
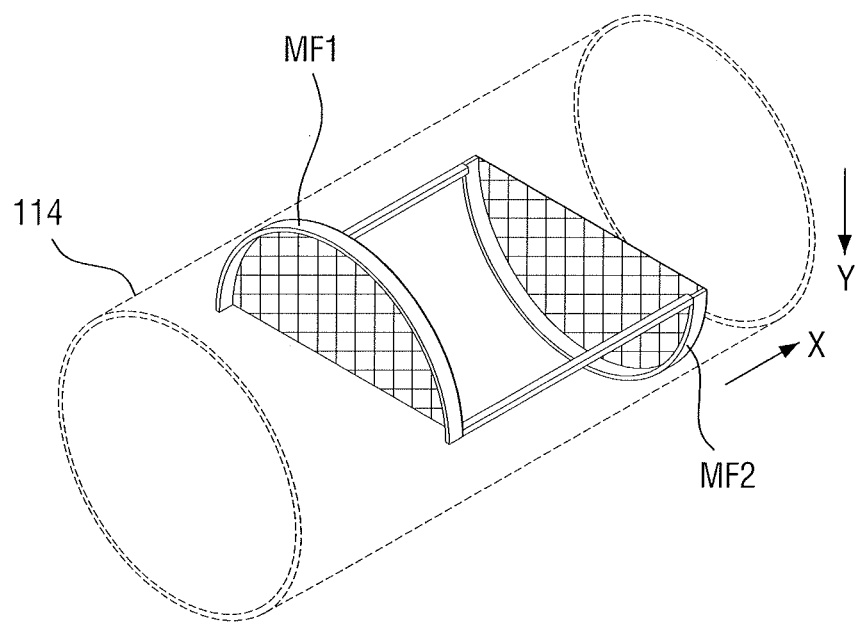
FIG. 9 illustrates a schematic view of a buffer inner tube of the apparatus for manufacturing an organic material according to an example embodiment.
Figure 10:
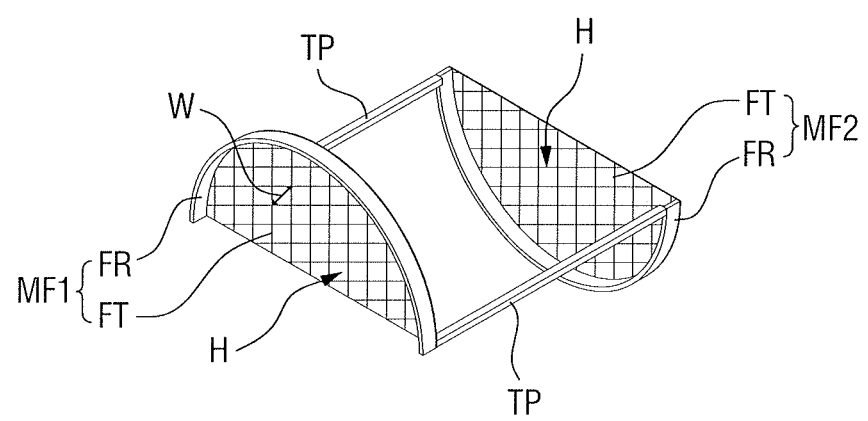
FIG. 10 illustrates a schematic view of mesh filters of the apparatus for manufacturing an organic material according to an example embodiment.

FIG. 9 is a schematic view of the buffer inner tube 114 of the apparatus 100 for manufacturing an organic material according to an example embodiment, and FIG. 10 is a schematic view of the mesh filters MF1 and MF2 of the apparatus 100 for manufacturing an organic material according to an example embodiment.

Referring to FIG. 9, the buffer inner tube 114 may be in the form of a hollow tube including an internal accommodating space. The cross section of the buffer inner tube 114 may be circular or may have various shapes such as an oval shape and a polygonal shape.

The buffer inner tube 114 may be made of a transparent material such as quartz, glass or borosilicate glass, or may be made of metal.

The mesh filters MF1 and MF2 may be disposed in the second direction Y perpendicular to the first direction X in which the buffer inner tube 114 extends in order to prevent the ash 154 generated in the process of subliming the organic material 150 (see FIG. 2) to be purified from flowing into the collecting inner tubes 116 and 118 (see FIG. 2).

The mesh filters MF1 and MF2 may be spaced apart from each other in the first direction X in which the buffer inner tube 114 extends and may be arranged not to overlap each other in order to facilitate the flow of the sublimed organic material 152 (see FIG. 2) while effectively blocking the ash 154 (see FIG. 2) generated in the process of subliming the organic material 150.

For example, when the cross section of the buffer inner tube 114 is circular, the first and second semicircular mesh filters MF1 and MF2 having a semicircular shape may be disposed apart from each other in the first direction X and may be arranged not to overlap each other. The first mesh filter MF1 and the second mesh filter MF2 may be disposed in different areas of the circular cross section of the buffer inner tube 114 cut in the second direction Y. In other implementations, three or more mesh filters MF may be disposed in different areas of the circular cross section of the buffer inner tube 114, or a plurality of mesh filters MF may also be disposed to overlap each other in an area of the circular cross section of the buffer inner tube 114.

Referring to FIG. 10, each of the first and second mesh filters MF1 and MF2 may include a filter portion FT and a frame portion FR.

The filter portion FT may be shaped like a metal mesh including a plurality of holes H. For example, the flat portion FT may be made of stainless steel, aluminum, gold, silver, platinum, nickel, Teflon, etc.

Each of the holes H included in the flat portion FT may have a width W of 0.001 to 0.1 µm. Accordingly, the holes H may pass the sublimed organic material 152 (see FIG. 2) but filter the ash 154 generated in the process of subliming the organic material 150 (see FIG. 2) to be purified, thereby preventing the ash 154 (see FIG. 2) from flowing into the collecting inner tubes 116 and 118 (see FIG. 2) and thus degrading the quality of a collected organic material.

The widths W of the holes H included in the filter portion FT of each of the first and second mesh filters MF1 and MF2 may be equal to each other or the widths W of the holes H included in the filter portion FT of each of the first and second mesh filters MF1 and MF2 may be different from each other within the range of 0.001 to 0.1 µm.

When the widths W of the holes H included in the filter portion FT of each of the first and second mesh filters MF1 and MF2 are equal, the holes H may be formed in the same process, which offers a process advantage. When the widths W of the holes H included in the filter portion FT of each of the first and second mesh filters MF1 and MF2 are different, the ash 154 (see FIG. 2) of different sizes may be filtered, thus improving the fluidity of gas.

The frame portion FR may surround edges of the filter portion FT. The shape of the frame portion FR may vary according to the shape of the filter portion FT.

Fixing members TP may be disposed between the first and second mesh filters MF1 and MF2 and may connect the first and second mesh filters MF1 and MF2 to fix the arrangement of the first and second mesh filters MF1 and MF2.

The fixing members TP may be bar-shaped and connect the respective frame portions FR of the first and second mesh filters MF1 and MF2 to each other.

The first and second mesh filters MF1 and MF2 spaced apart from each other and fixed to each other, e.g., in a non-overlapping manner, may be inserted into the buffer inner tube 114 (see FIG. 9), and the buffer inner tube 114 (see FIG. 9) may be placed between the loading inner tube 112 (see FIG. 2) and the collecting inner tubes 116 and 118 (see FIG. 2). This may facilitate the flow of the sublimed organic material 152 (see FIG. 2) from the loading inner tube 112 (see FIG. 2) to the collecting inner tubes 116 and 118 (see FIG. 2) while blocking the ash 154 (see FIG. 2) generated in the process of subliming the organic material 150 from flowing into the collecting inner tubes 116 and 118 (see FIG. 2).

FIGS. 11 through 15 respectively are schematic views of example mesh filters of the apparatus 100 for manufacturing an organic material according example embodiments.

Figure 11:
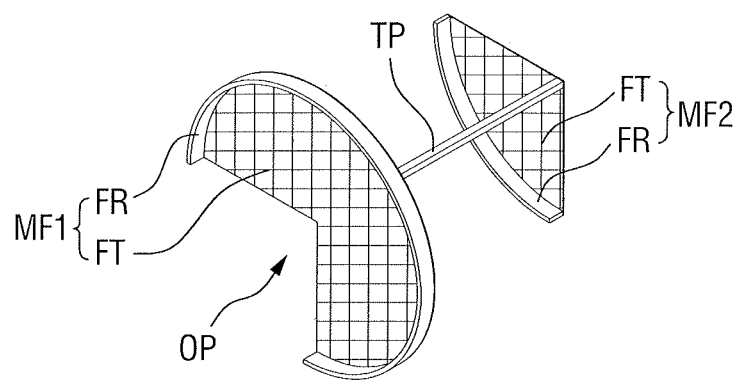
FIGS. 11 through 15 respectively illustrate schematic views of example mesh filters of the apparatus for manufacturing an organic material according to an example embodiment.
Figure 12:
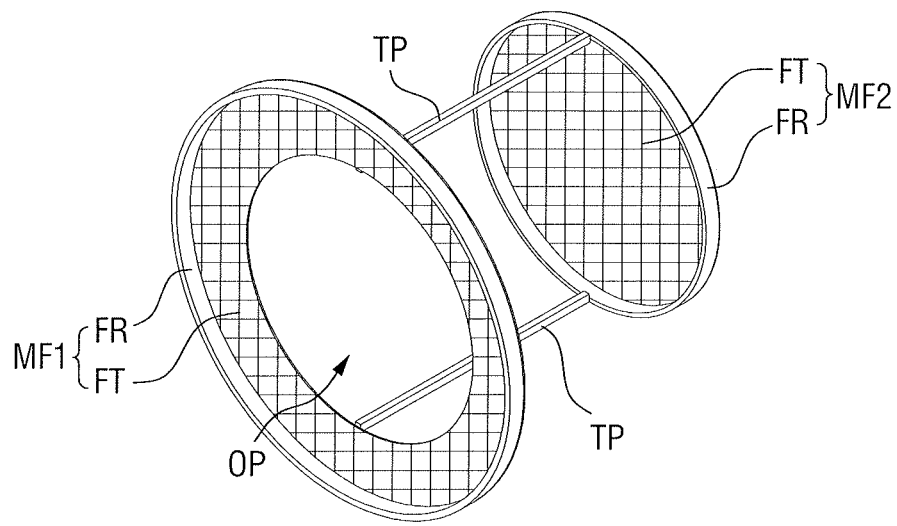

Referring to FIGS. 11 and 12, a first mesh filter MF1 and a second mesh filter MF2 each include a frame portion FR and a filter portion FT and are separated from each other by a fixing member TP or fixing members TP. The first mesh filter MF1 and the second mesh filter MF2 may have different shapes. The first mesh filter MF1 may have an opening area OP, and the second mesh filter MF2 may be disposed to correspond to the opening area OP of the first mesh filter MF1. Accordingly, the first mesh filter MF1 and the second mesh filter MF2 may respectively be disposed in different areas of the circular cross section of the buffer inner tube 114 (see FIG. 9).

Figure 13:
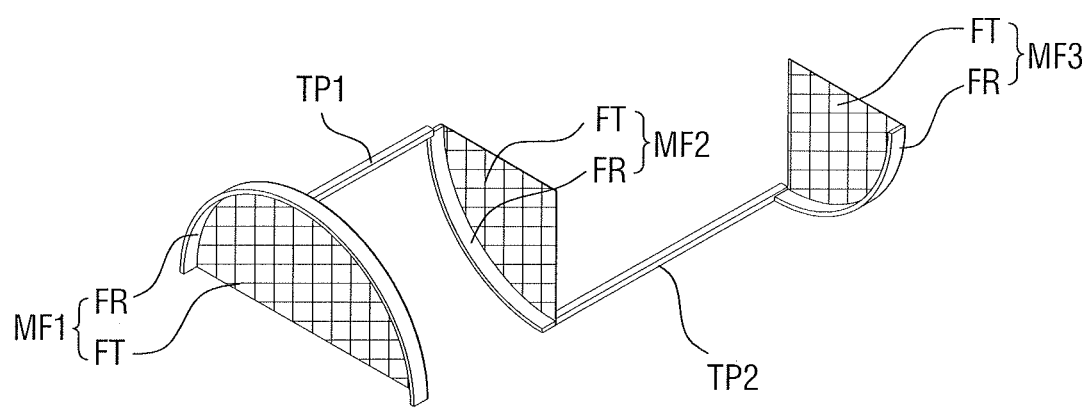

Referring to FIG. 13, a first mesh filter MF1, a second mesh filter MF2 and a third mesh filter MF3 each include a frame portion FR and a filter portion FT, and may be spaced apart from each other by first and second fixing members TP1 and TP2. The first mesh filter MF1 may have a different shape from the second and third mesh filters MF2 and MF3. In addition, the first mesh filter MF1, the second mesh filter MF2 and the third mesh filter MF3 may respectively be disposed in different areas of the circular cross section of the buffer inner tube 114 (see FIG. 9).

Figure 14:
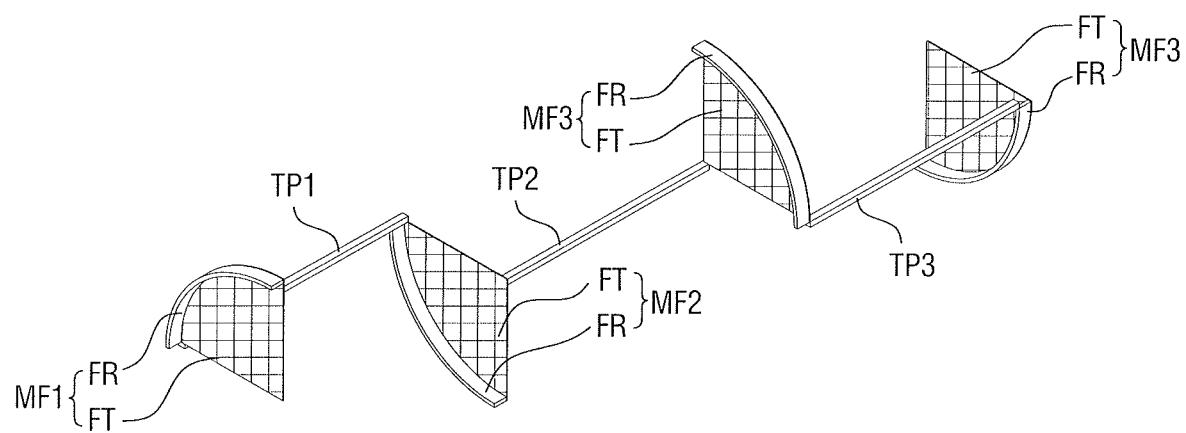

Referring to FIG. 14, a first mesh filter MF1, a second mesh filter MF2, a third mesh filter MF3, and a fourth mesh filter MF4 may each include a frame portion FR and a filter portion FT, and may be spaced apart from each other by first, second, and third fixing members TP1, TP2 and TP3. The first mesh filter MF1, the second mesh filter MF2, the third mesh filter MF3, and the fourth mesh filter MF4 may have the same shape. The first mesh filter MF1, the second mesh filter MF2, the third mesh filter MF3 and the fourth mesh filter MF4 may be disposed in different areas of the circular cross section of the buffer inner tube 114 (see FIG. 9).

Figure 15:
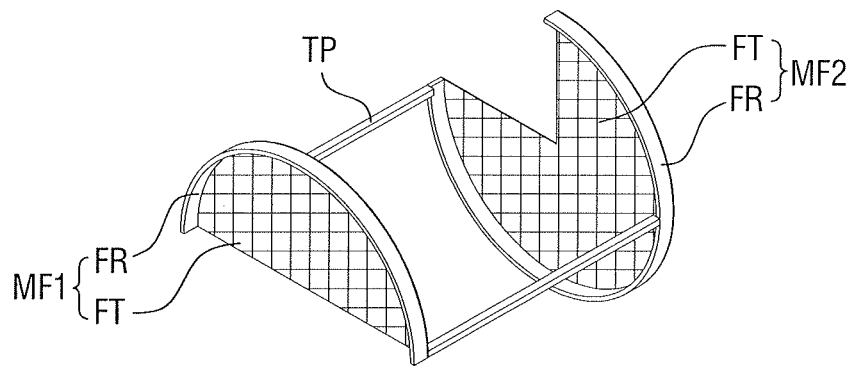

Referring to FIG. 15, a first mesh filter MF1 and a second mesh filter MF2 each include a frame portion FR and a filter portion FT and are spaced apart from each other by fixing members TP. The first mesh filter MF1 and the second mesh filter MF2 may have different shapes. The first mesh filter MF1 and the second mesh filter MF2 may partially overlap each other.

As described above, in the organic material manufacturing apparatus 100 (see FIG. 1) according to example embodiments, the number of mesh filters MF, the shapes of the mesh filters MF, the arrangement of the mesh filters MF, and whether the mesh filters MF overlap may vary according to the widths W (see FIG. 10) of the holes H (see FIG. 10)

of the mesh filters MF, the type of the sublimed organic material 152 (see FIG. 2), the amount of the ash 154 (see FIG. 2) generated in the process of subliming an organic material, etc.

Figure 16:
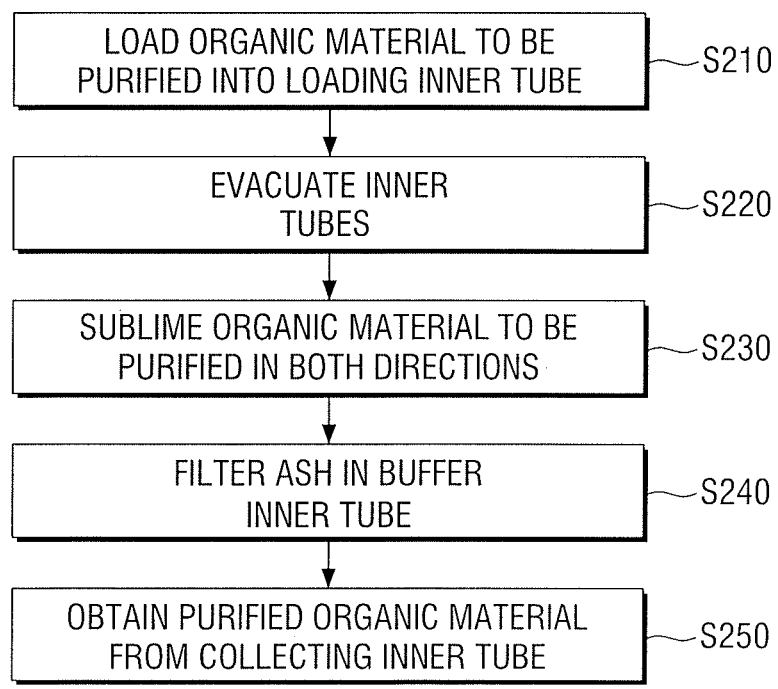
FIG. 16 illustrates a flowchart schematically illustrating a method of manufacturing an organic material according to an example embodiment.

FIG. 16 is a flowchart schematically illustrating a method of manufacturing an organic material according to an example embodiment. The method of manufacturing an organic material will be described by additionally referring to FIGS. 1 and 2.

Referring to FIGS. 16, 1 and 2 together, in the method of manufacturing a purified organic material, an organic material to be purified is loaded on the mesh boat MB of the loading inner tube 112 (operation S210). For example, an organic material 150 to be purified may be loaded on each of the flat surfaces PF1 and PF2 of the mesh boat MB and the lower surface 112*a* of the loading inner tube 112.

Next, the inside of a plurality of inner tubes 112, 114, 116, and 118 may be evacuated by using the vacuum pump 140 (operation S220). For example, the inner tubes 112, 114, 116, and 118 may be evacuated to about 200 Pa by using the vacuum pump 140. A surface of the loading inner tube 112 on the side of the vacuum pump 140 may be open while a surface of the loading inner tube 112 opposite to the vacuum pump 140 may be closed, and a slight pressure gradient may be formed in the evacuation process. Thus, a pressure gradient in which the pressure decreases from the loading inner tube 112 toward the collecting inner tubes 116 and 118 may be formed.

Next, the organic material 150 to be purified may be made to sublime to both above and below the mesh boat MB by applying heat to the organic material 150 (operation S230).

For example, the inner tubes 112, 114, 116, and 118 may be heated to different temperatures by operating the heaters 132, 134, 136 and 138 such that the temperature decreases from the loading inner tube 112 toward the second collecting inner tube 118. The buffer inner tube 114 may be heated to a temperature equal to or higher than the temperature of the loading inner tube 112 in order to prevent the temperature of the loading inner tube 112 from being lowered due to the temperature difference between the loading inner tube 112 and the first collecting inner tube 116 adjacent to the loading inner tube 112.

The temperature may be constant in each of the loading inner tube 112, the buffer inner tube 114, the first collecting inner tube 116*m* and the second collecting inner tube 118, while a temperature distribution may be formed across all of the loading inner tube 112, the buffer inner tube 114, the first collecting inner tube 116, and the second collecting inner tube 118.

The organic material 150 located in the loading inner tube 112 starts to sublime when heated to a temperature higher than a sublimation point. The organic material 150 loaded on each of the flat surfaces PF1 and PF2 of the mesh boat MB may sublime to both above and below each of the flat surfaces PF1 and PF2.

Next, ash 154 generated in the process of subliming the organic material 150 is filtered by a plurality of mesh filters MF1 and MF2 disposed in the buffer inner tube 114 (operation S240). For example, the organic material 152 sublimed in the loading inner tube 112 and the ash 154 generated in the process of subliming the organic material 150 move from the loading inner tube 112 to the first and second collecting inner tubes 116 and 118 via the buffer inner tube 152 according to the pressure gradient. Thus, a plurality of mesh filters MF may be placed in the buffer inner tube 114 to block the ash 154 generated in the process of subliming the organic material 150.

Next, a purified organic material may be obtained from the collecting inner tubes 116 and 118 (operation S250).

For example, the organic material 152 sublimed in the loading inner tube 112 may move to the first collecting inner tube 116 via the buffer inner tube 114, and a material contained in the sublimed organic material 152 may be condensed or recrystallized according to the temperature of the first collecting inner tube 116.

Then, materials that have not been condensed or recrystallized at the temperature of the first collecting inner tube 116 may move to the second collecting inner tube 118, and a material contained in the sublimed organic material 152 may be condensed according to the temperature of the second collecting inner tube 118. By using this principle, it may be possible to obtain a desired material according to the temperature of each of the inner tubes 112, 114, 116, and 118.

In the organic material manufacturing apparatus 100 (see FIG. 1) according to the present example embodiment, the mesh boat MB (see FIG. 2) is placed to prevent the ash 154 (see FIG. 2) generated in the process of subliming the organic material 150 (see FIG. 2) to be purified from covering the organic material 150 in the loading inner tube 112 (see FIG. 2) and thus interrupting the manufacturing process while increasing the production rate of the manufacturing process. In addition, the mesh filters MF (see FIG. 2) are placed in the buffer inner tube 114 to effectively prevent the ash 154 (see FIG. 2) from flowing into the collecting inner tubes 116 and 118, thereby improving the quality of a manufactured organic material.

By way of summation and review, a sublimation purification method may be used to purify an organic material used for an organic light emitting device. Sublimation refers to a solid-gas transition that occurs at temperatures and pressures below a triple point in a phase diagram. A material that is vaporized by heating may not be decomposed, even at a relatively high temperature, at a pressure below the triple point. In a sublimation apparatus capable of controlling a temperature gradient using this property, a material to be purified may be heated to separate pure material (in an undecomposed state) from impurities having a different sublimation point from that of the desired material. This operation may be referred to as a vacuum sublimation method. The vacuum sublimation method is a pure physical method and is useful for purification of organic materials for organic light emitting devices because it does not depend on the use of auxiliary reagents or other chemical methods (and thus may avoid contamination of samples) and may provide a high separation rate.

One method of purifying an organic material for an organic light emitting device is a train sublimation method, in which a material to be purified is placed at an end of a long hollow tube, and the inside of the tube is evacuated by using a vacuum pump. In this state, the tube is heated with a heater to form a temperature gradient across the entire tube. Thus, a desired material may be separated from impurities using the difference in recrystallization position due to the difference in sublimation point between the desired material and the impurities.

Ash may be generated in the process of subliming an organic material to be purified during the process of manufacturing an organic material to be used for an organic light emitting device. The ash may lower the production yield by covering the organic material to be purified in a loading inner tube and may degrade the quality of a collected organic material by flowing into a collecting inner tube.

According to embodiments of the present disclosure, it may be possible to provide an apparatus for manufacturing an organic material with improved production yield, shortened process time, and improved purification efficiency and quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for manufacturing an organic material, the apparatus comprising:
    an outer tube including an internal accommodating space; and
    at least one loading inner tube and at least one collecting inner tube disposed in the internal accommodating space, the at least one loading inner tube including a mesh boat disposed in a first direction in which the at least one loading inner tube extends;
    a buffer inner tube between the loading inner tube and the at least one collecting inner tube, the buffer inner tube including a mesh filter,
    wherein the mesh boat includes a plurality of flat surfaces spaced apart from each other along a second direction perpendicular to the first direction, the plurality of flat surfaces being coupled to one another by a plurality of connection members that are offset from one another, and
    wherein the mesh filter comprises a plurality of mesh filters extending along the second direction and being offset from each other along the first direction, the mesh filters comprising filter portions that do not overlap each other when viewed along the first direction, one of the filter portions being coupled to another one of one of the filter portions by a fixing member extending along the first direction, the fixing member being in an inner space of the buffer inner tube.

2. The apparatus as claimed in claim 1, wherein the mesh boat includes a flat surface disposed along the first direction, and the flat surface is a metal mesh.

3. The apparatus as claimed in claim 1, wherein each of the mesh filters includes a frame portion and a filter portion of the filter portions, and the filter portion is a metal mesh.

4. The apparatus as claimed in claim 1, wherein the mesh filter is semicircular when viewed along the first direction.

5. The apparatus as claimed in claim 4, wherein the mesh filters include a first mesh filter and a second mesh filter spaced apart from each other along the first direction, and the first mesh filter and the second mesh filter are located in different areas when projected on a cross section of the buffer inner tube cut in the second direction.

* * * * *